United States Patent
Glover et al.

(10) Patent No.: US 9,875,951 B2
(45) Date of Patent: Jan. 23, 2018

(54) HEAT SINK WITH ORIENTABLE FINS

(75) Inventors: Troy W. Glover, Raleigh, NC (US); Chunjian Ni, Cary, NC (US); Whitcomb R. Scott, III, Chapel Hill, NC (US); Mark E. Steinke, Durham, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 1517 days.

(21) Appl. No.: 13/302,729

(22) Filed: Nov. 22, 2011

(65) Prior Publication Data

US 2013/0126145 A1 May 23, 2013

(51) Int. Cl.
*F28F 7/02* (2006.01)
*H01L 23/36* (2006.01)
*H01L 23/40* (2006.01)
*H01L 23/467* (2006.01)

(52) U.S. Cl.
CPC .......... *H01L 23/36* (2013.01); *H01L 23/4093* (2013.01); *H01L 23/467* (2013.01); *H01L 2924/0002* (2013.01)

(58) Field of Classification Search
CPC . F28D 2021/0029; H01L 23/34; H01L 23/40; H01L 23/4093; H01L 23/4006; H01L 23/473
USPC ............................................... 165/80.1–80.3
See application file for complete search history.

(56) References Cited

U.S. PATENT DOCUMENTS

| | | | |
|---|---|---|---|
| 5,386,144 A * | 1/1995 | Variot et al. ................... | 257/718 |
| 5,870,285 A * | 2/1999 | Kosteva et al. ............... | 361/704 |
| 5,898,571 A * | 4/1999 | Mertol .......................... | 361/704 |
| 6,829,144 B1 * | 12/2004 | Stutzman et al. ............. | 361/704 |
| 6,876,550 B2 | 4/2005 | Sir-Jayantha et al. | |
| 7,203,065 B1 * | 4/2007 | Sin Yan Too ................. | 361/704 |
| 7,242,583 B2 * | 7/2007 | Amber et al. ................ | 361/707 |
| 7,946,336 B2 * | 5/2011 | Wang et al. .................. | 165/80.3 |
| 8,134,837 B2 * | 3/2012 | Hohlfeld et al. ............. | 361/718 |
| 2004/0012927 A1 * | 1/2004 | Lee et al. ...................... | 361/704 |
| 2006/0274503 A1 * | 12/2006 | Lee et al. ...................... | 361/704 |
| 2007/0080471 A1 * | 4/2007 | Yazawa ......................... | 257/783 |

* cited by examiner

*Primary Examiner* — Grant Moubry
*Assistant Examiner* — Jason Thompson
(74) *Attorney, Agent, or Firm* — Jeffrey L. Streets (57) ABSTRACT

A heat sink comprises a first thermally conductive base having a first face to thermally engage a heat-generating electronic component and a second thermally conductive base with a plurality of fins on a first face and a second face to engage the first base. The fins on the second base are positionable in either of two orientations relative to the heat-generating electronic component to which the heat sink is coupled. The fins are selectively placed in the orientation that best utilizes the direction of air flow available to the heat sink. The orientable fins of the heat sink afford flexibility in arranging the heat-generating electronic component on a circuit board or in arranging a circuit board within a computer chassis.

20 Claims, 10 Drawing Sheets

HEAT SINK WITH ORIENTABLE FINS

BACKGROUND

Field of the Invention

The present invention relates to a heat sink to remove heat from a heat-generating electronic component used in a computer.

Background of the Related Art

Computer systems require removal of heat from heat-generating electronic components such as processors. Heat-generating electronic components are often coupled to a generally planar circuit board having a series of electronic connectors along an edge of the circuit board to facilitate electronic engagement between the circuit board and a motherboard. Electrical current and data are routed to and from the heat-generating electronic component through the motherboard and the electronic connectors of the circuit board. Heat generated by the electronic component may be transferred by conduction to a heat sink having a plurality of fins coupled to the heat sink to dissipate heat to air flowing through a computer chassis housing the circuit board. One or more air movers, such as fans, may be used to move air through the computer chassis so that the air will flow across the fins to enhance dissipation of heat from the heat sink. Air movers are fixed relative to the computer chassis to draw air into one end of the chassis, across components disposed within the chassis and then through the air movers to exit the chassis.

Electronic components are generally coupled to a circuit board in an arrangement that saves space and promotes compactness of the computer. Furthermore, an expansion card may be disposed horizontally or vertically with respect to the motherboard within a chassis as needed to utilize available space given the form factor of the chassis. Similarly, an electronic component, such as a processor, may be disposed on the expansion card in an orientation that provides the most efficient layout of the components on the expansion card. A heat sink may be disposed on the electronic component to conduct heat generated by the electronic component through the heat sink to a plurality of air-cooled fins to remove heat from the electronic component by dissipation to surrounding air flow. For computers relying upon air flow to enhance heat dissipation from the fins, the fins on the heat sink must be favorably oriented with respect to the air flow through the chassis in order to optimize the operating temperature of the electronic component.

BRIEF SUMMARY

One embodiment of the present invention provides a heat sink comprising a first thermally conductive base having a first face securable to a heat-generating device and a second face opposite the first face, a second thermally conductive base having a first face with a plurality of fins and a second face selectively engaging the second face of the first base, a biasing member to bias the second face of the first base to engage the second face of the second base in a first orientation and in a second orientation that is about 90 degrees out of phase with the first orientation, and an alignment member extending from at least one of the first and second bases to prevent relative rotation between the first and second bases from the first orientation or the second orientation, wherein the second base is movable relative to the first base from the first orientation to the second orientation by overcoming the biasing member to remove the second face of the second base from engagement with the second face of the first base, rotating the second base relative to the first base 90 degrees from the first orientation to the second orientation, and releasing the heat sink to allow the biasing member to re-engage the second face of the second base with the second face of the first base.

DETAILED DESCRIPTION

One embodiment of the present invention provides a heat sink comprising a first thermally conductive base having a first face for conductively engaging a heat-generating electronic component and a second face. The heat sink further comprises a second thermally conductive base having a first face, supporting a plurality of fins, and a second face to conductively engage the second face of the first base to form a heat transfer interface across which heat generated by the heat-generating electronic component can be transferred for dissipation by the fins. The second base of the heat sink engages the first base of the heat sink in a plurality of permissible fin orientations to facilitate the alignment of the fins on the second base with a direction of cooling air movement through a computer chassis to maximize the dissipation of heat from the heat-generating electronic component. This structure permits the heat sink to be used on a heat-generating electronic component on a circuit board disposed within a computer chassis in either of two different orientations, and it prevents the need for stocking multiple heat sinks having different fin orientations.

In one embodiment of the heat sink of the present invention, a spring clip releasably engages the first base of the heat sink with the second base of the heat sink in two or more permitted fin orientations relative to the first base. A first portion of the spring clip is disposed on the first base and a second portion of the spring clip is disposed on the second base in a manner that determines the orientations in which the second base will releasably engage the first base. In a first permissible orientation, the second base, which has the heat sink fins, is 90 degrees out of phase a second permissible orientation of the second base. Having the first and second permissible orientations enables the heat sink to be easily adjusted for use where the heat-generating electronic component is aligned with the air flow through the computer chassis or where the air flow is transverse with the air flow through the computer chassis. Optionally, the spring clip may be designed to prevent releasable engagement of the second base with the first base in any orientation other than predetermined orientations.

For example, but not by limitation, the first portion of the spring clip on the first base may comprise, in one embodiment, a pair of opposed spring members having an interior therebetween, and the second portion of the spring clip provided on the second base may comprise an insertion member sized to be received within the interior of the first portion of the spring clip by elastic separation of the spring members of the first portion during insertion of the insertion member of the second portion. The first portion of the spring clip on the first base may comprise guide portions to facilitate centering and insertion of the insertion member on the second base, and/or the insertion member on the second portion of the spring clip may comprise tapered edges to facilitate elastic spreading of the spring members of the first portion during insertion of the insertion member into the first portion. The insertion member may have a cross-section that is generally round or a polygon, such as a square. Advantageously, an insertion member with a square cross-section may be used to limit the second base to the first and second orientations relative to the first base.

In an alternative embodiment of the spring clip, the second portion of the spring clip may comprise a first pair of generally parallel shaft portions and a second pair of generally parallel shaft portions disposed within an aperture in the second base. The first pair of shaft portions may be in an orientation generally perpendicular to the first pair of shaft portions to define the orientations in which the second base is able to releasably engage the first base. The first pair or the second pair of shaft portions of the second portion of the spring clip on the second base are spaced to elastically displace the spring members of the first portion of the spring clip on the first base during engagement of the second base with the first base in the first or the second permissible fin orientation, respectively, and the spring clip prevents engagement of the second base with the first base in fin orientations that do not provide for alignment of either the first or second pair of shaft portions of the second portion of the spring clip with the spring members of the first portion of the spring clip.

In an alternate embodiment, at least one of the first and second bases comprises a key that prevents relative rotation between the first and second bases while the bases are engaged. Accordingly, the orientation between the first and second bases can only occur when the first and second bases have been disengaged and separated by overcoming the biasing force of the biasing member. Preferably, the key will only permit engagement of the first base with the second base in predetermined orientations of the second base with the first base, and the key obstructs engagement of the first base with the second base in orientations other than the permitted fin orientations. For example, a key on the second face of the first base may protrude beyond the plane of the second face of the first base and in the direction away from the first face to prevent engagement of the first base with the second base in orientations other than a first fin orientation and a second fin orientation, which may be, for example, 90 degrees out of phase with the first fin orientation. The key may be formed along the periphery of the second face of the first base, and the key may thereby protrude beyond and adjacent to the second face of the second base where the second base is in a first fin orientation or in a second fin orientation. The key may be positioned on the first base to engage the second face of the second base and thereby prevent the second face of the second base from engaging the second face of the first base in all orientations therebetween other than the first fin orientation and the second fin orientation.

In an alternate embodiment, a key may be formed within the periphery of the second face of the first base to be received in a one of two or more notches or recesses within the second face of the second base. The first notch or recess may receive the key in a first permitted fin orientation, and the second notch or recess may receive the key in a second permitted fin orientation. Alternately, the key may be formed within the periphery of the second face of the first base to be received within one of two or more bays or channels in the periphery of the second face of the second base. The first bay or channel may receive the key in the first permitted fin orientation and the second bay or channel may receive the key in the second permitted fin orientation. The key may be formed within the periphery of the second face of the first base to engage the second face of the second base at a location outside any notch, recess, channel or bay to thereby prevent the second face of the second base from conductively engaging the second face of the first base in orientations therebetween other than those corresponding to the first fin orientation or the second fin orientation which may be 90 degrees out of phase with the first fin orientation.

In another alternate embodiment, the first base may comprise two keys and the second base may comprise three or more notches, recesses, channels or bays to permit both of the keys to be received into notches, recesses, channels or bays in either of a first fin orientation and a second fin orientation that is 90 degrees out of phase with the first fin orientation. In fin orientations other than the permitted first and second fin orientations, the two keys will engage the second face of the second base to prevent the second face of the second base from conductively engaging the second face of the first base.

In another embodiment of the heat sink of the present invention, the heat sink comprises a spring clip having a first portion on the first base, where the first portion has a pair of opposed spring members defining an interior, and a second portion on the second base, where the second portion comprises a rounded member sized to be received within an interior of the first portion. The rounded member of the second portion of the spring clip facilitates the elastic displacement of the spring members one from the other as the second base is forced into conductive engagement with the first base to releasably engage the first and second portions of the spring clip. The rounded member permits rotation of the second base relative to the first base from a first fin orientation to a second fin orientation.

An alignment structure may impair full engagement between the second face of the second base and the second face of the first base in orientations therebetween other than a first orientation and a second orientation 90 degrees out of phase with the first orientation. In one embodiment of the heat sink, a key may be disposed on one of the first base and the second base to be received in a receiving element, such as a notch, recess, channel or bay, disposed on the other of the first base and the second base to determine the permitted fin orientations.

Figure 1A:
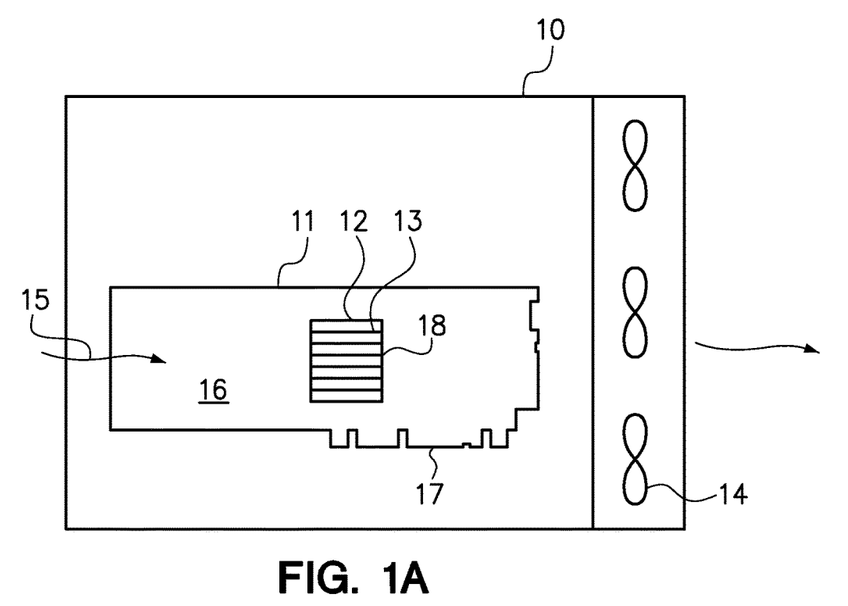
FIG. 1A is a diagram of an expansion card having a heat sink disposed in a first orientation within a computer chassis.

FIG. 1A is a diagram of an expansion card 11 connected by connectors 17 in a first orientation within a computer chassis 10. The expansion card 11 has a first heat sink 13 in thermal communication with a heat generating device 12 (disposed under the heat sink), such as a processor, on the circuit board 11 to transfer heat from the heat generating device 12 to a plurality of air-cooled fins 18 on the first heat sink 13. In order to achieve efficient heat transfer, the fins 18 are aligned with the direction of air flow 15 through the computer chassis 10. The heat sink 13 is secured in face-to-face thermally conductive engagement with the heat generating device to facilitate the transfer of heat from the heat generating device 12 to the first heat sink 13 for dissipation into air flow 15 around the fins 18. The air flow 15 through the computer chassis 10 is provided by air movers 14, such as fans that draw cooling air flow through the computer chassis 10. Rack or computer room air conditioner (CRAC) air movers may also be used to provide the air flow.

Figure 1B:
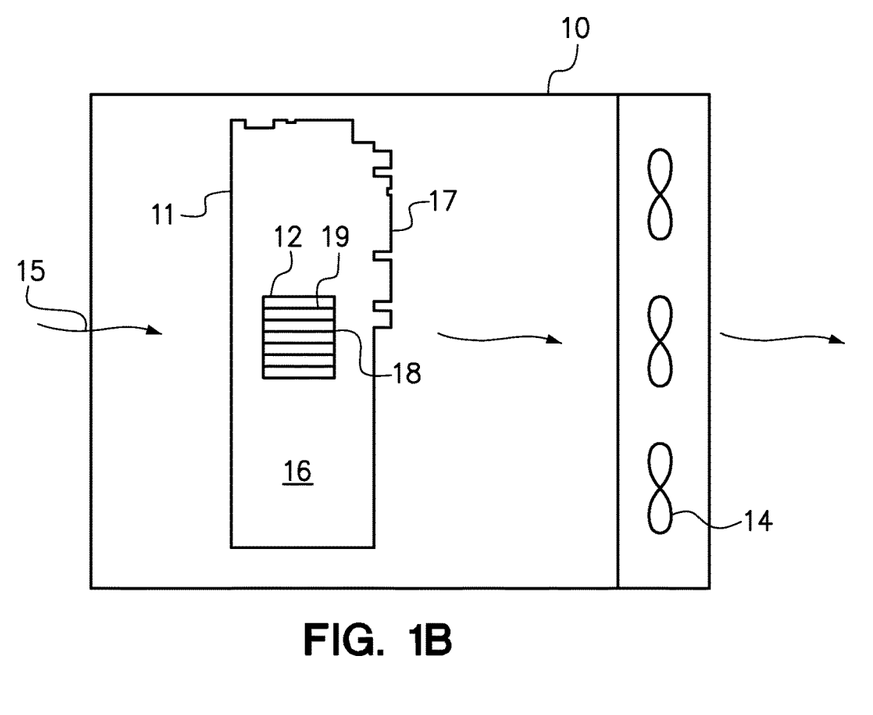
FIG. 1B is a diagram of the expansion card of FIG. 1 having a second heat sink disposed in a second orientation within the computer chassis.

FIG. 1B is a schematic illustrating a circuit board 11 connected by connectors 17 in a second orientation within the computer chassis 10 and having a second heat sink 19 in conductive engagement with the heat generating device 12 to transfer heat generated by the device 12 to the plurality of fins 18 aligned with the direction of air flow 15 through the computer chassis 10. The air flow 15 is again provided by a plurality of air movers 14. Similar to the arrangement of FIG. 1A, the second heat sink 19 is secured to the heat generating device 12 to dispose a face (not shown) on the heat generating device 12 to facilitate the transfer of heat generated by the device 12 through the second heat sink 19 for dissipation to air flow 15 through the fins 18. The connectors 17 on the circuit board 11 in FIG. 2 are generally transverse to the direction of the air flow 15, and are about 90 degrees out of phase with the position of the connectors 17 on the circuit board 11 in FIG. 1A, those being generally aligned with the direction of air flow 15. The orientation of the first heat sink 13 of FIG. 1A would not effectively dissipate heat generated by the device 12 and conductively transferred to the fins 18 in the second orientation illustrated in FIG. 2 because the fins 18 of the first heat sink 13 would not be aligned with the direction of the air flow 15 through the computer chassis 14. It is necessary, therefore, to stock two different models of a heat sink, a first heat sink 13 having fins 18 in a first orientation for circuit boards connected in the orientation of the circuit board 11 in FIG. 1A and a second heat sink 19 having fins 18 for circuit boards connected in the orientation of the circuit board 11 in FIG. 1B.

Figure 2A:
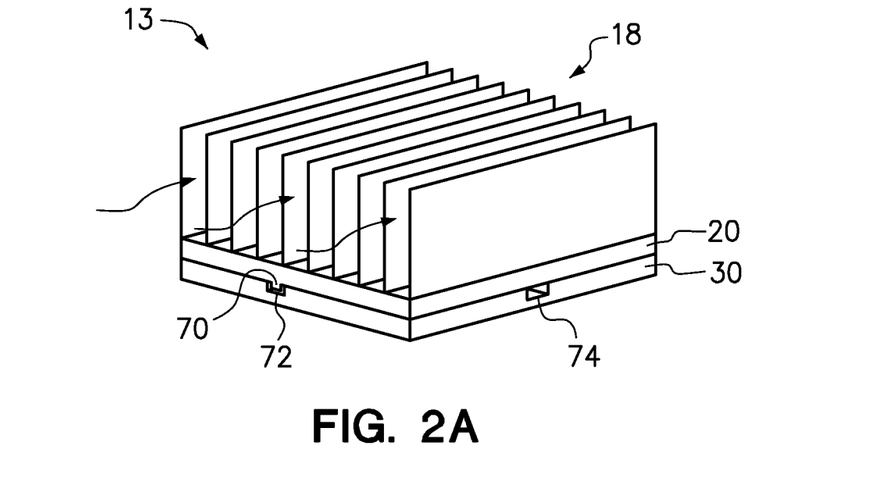
FIGS. 2A-2D are a series of perspective views of a heat sink, in accordance with one embodiment of the present invention, having a second base being repositioned from a first orientation to a second orientation.

FIGS. 2A-2D are a series of perspective views of a heat sink, in accordance with one embodiment of the present invention, having a second base being repositioned from a first orientation to a second orientation. In FIG. 2A, the first base 30 is shown in face-to-face engagement with the second base 20, which has fins 18 extending therefrom. As shown, the second base 20 has a key 70 received within a first notch 72 on the first base 30, which also has a second notch 74 on an adjacent side. Accordingly, the heat sink fins 18 are aligned with the airflow (shown generally from left to right on the page).

Figure 2B:
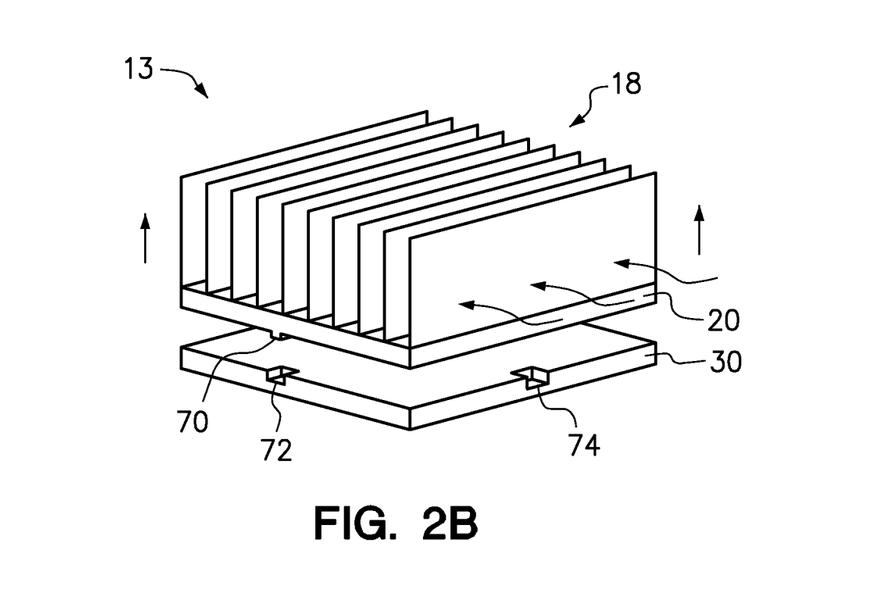

In FIG. 2B, the expansion card, on which the heat sink 13 is installed, has been installed in a computer chassis such that the air flow (shown generally from right to left on the page) is generally perpendicular to the heat sink fins 18. Since this will not produce good heat transfer, the second base 20 and heat sink fins 18 should be reoriented. Specifically, FIG. 2B shows the second base 20 having been disengaged and separated from the first base 30, such that the key 70 is no longer secured in the first notch 72. Although the biasing member is not shown, it is necessary to overcome the biasing force to get the second base 20 into this separated position.

Figure 2C:
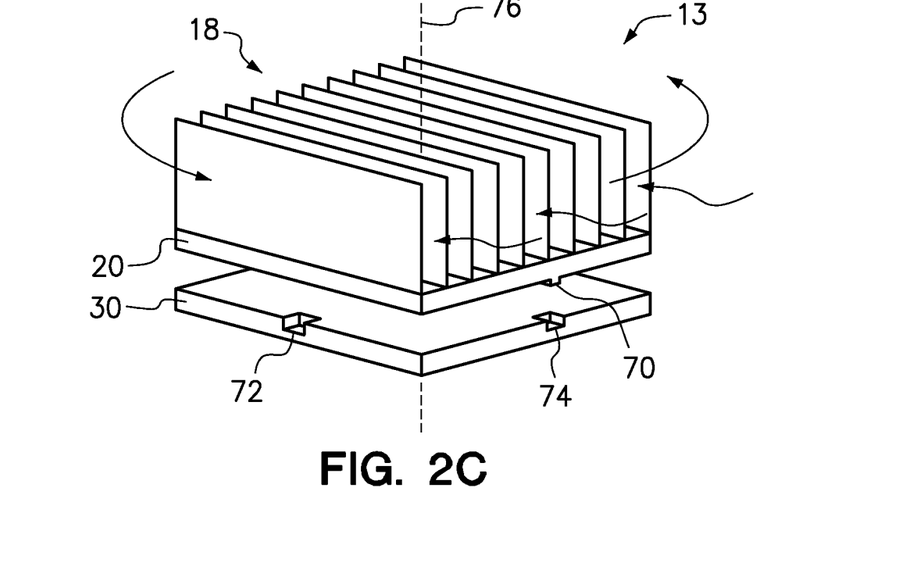

In FIG. 2C, the second base 20 is rotated 90 degrees about a central axis 76 while the second base 20 is still in the separated position. At this orientation, the heat sink fins 18 are now in alignment with the air flow.

Figure 2D:
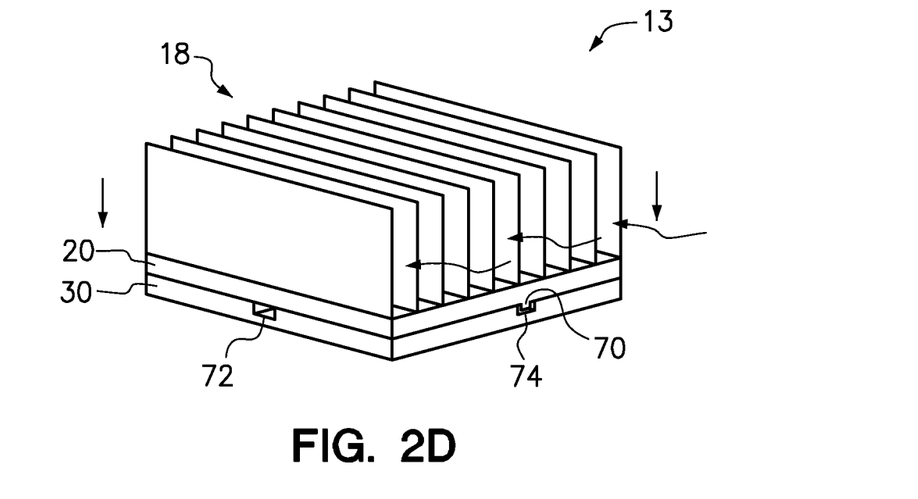

In FIG. 2D, the second base 20 is allowed to re-engage the first base 30. Accordingly, the heat sink 13 is again in an operative condition, but is now in a second orientation (FIG. 2D) as compared with the first orientation (FIG. 2A). As shown, the key 70 is now received in the second notch 74 to prevent accidental rotation of the second base 20 relative to the first base 30.

Figure 3:
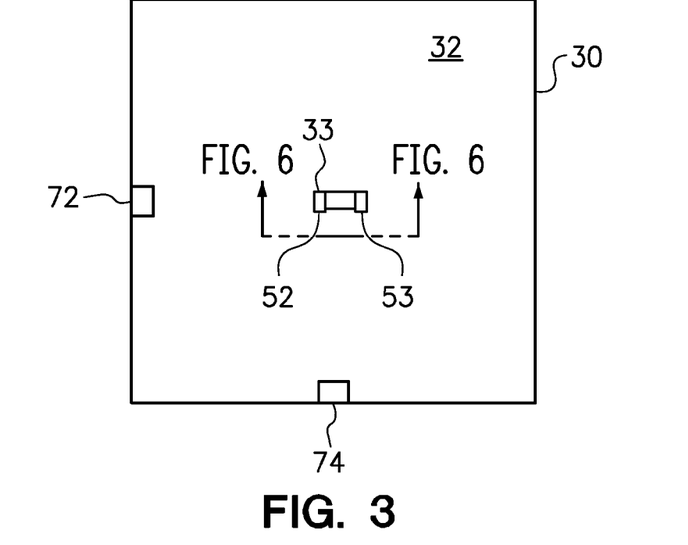
FIG. 3 is a plan view of a second face of a first thermally conductive base having a first portion of a spring clip thereon.

FIG. 3 is a plan view of the first thermally conductive base 30 having a first face (not shown) to thermally engage a heat generating device, such as a processor (not shown), a second face 32 to engage a second thermally conductive base, and a first portion 33 of a spring clip having a pair of opposed spring members 52, 53 to releasably engage a second portion of the spring clip to secure the second base to the first base 30 to bias a face of the second base against the face 32 of the first base 30. The first portion 33 of the spring clip is illustrated in FIG. 3 as being disposed generally central to the second face 32, but may be located at other positions. The second face 32 of the first base 30 is illustrated in FIG. 3 as being square, but may have other shapes. Also note the presence of the notches 72, 74 that serve as alignment features.

Figure 4:
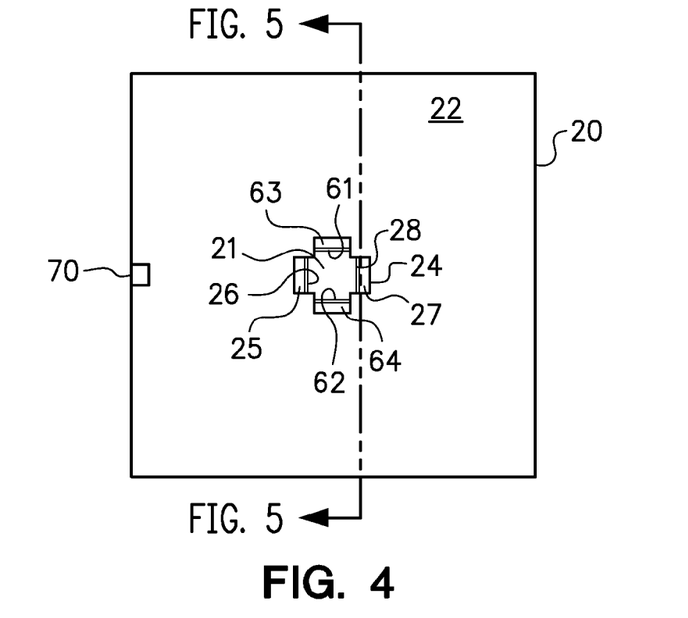
FIG. 4 is a plan view of a second face of a second thermally conductive base to engage the first base of FIG. 3, the second face of the second base having a second portion of the spring clip thereon.

FIG. 4 is an elevation view of the second thermally conductive base 20 having a first face (not shown) to support a plurality of air-cooled fins (not shown), a second face 22 to engage the first base, and a second portion 24 of the spring clip. The second portion 24 comprises an aperture 21 containing a first pair of parallel shaft portions 61, 62 and a second pair of parallel shaft portions 26, 28 therein. The shaft portions 61, 62 of the first pair are spaced apart within the aperture 21 to facilitate releasable engagement between the second portion 24 of the spring clip and the first portion of the spring clip on the first base. The shaft portion 61 is adjacent to spring member passage 63 and the opposed shaft portion 62 is adjacent to spring member passage 64. Similarly, the second pair of parallel shaft portions 26, 28 are spaced apart within the aperture 21 to facilitate releasable engagement between the second portion 24 of the spring clip and the first portion of the spring clip. The shaft portion 26 is adjacent to spring member passage 25 and opposed shaft portion 28 is adjacent to spring member passage 27. Also note the presence of the key 70 that serves as an alignment feature, as discussed in relation to FIGS. 2A-2D.

Figure 5:
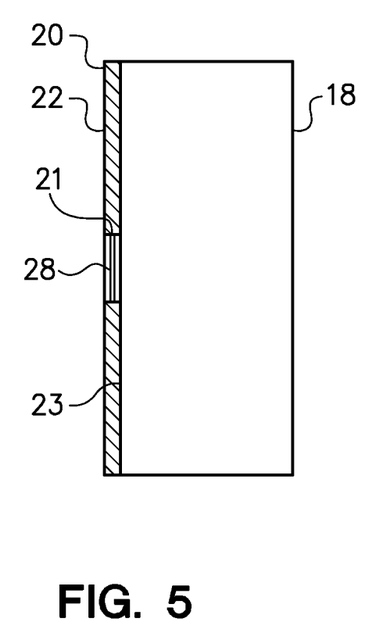
FIG. 5 is a cross-sectional side view of the second base of FIG. 4.

FIG. 5 is a cross-sectional side view of the second base 20 of FIG. 4 to illustrate the position of a fin 18 on the first face 23 of the second base 20. It will be understood that additional, parallel fins are hidden by the single fin 18 shown in FIG. 5. The cross-sectional view of FIG. 5 is taken through the spring member passage 27 of the second base 20 at the second portion 24 of the spring clip. The shaft portions 61, 62 are positioned within the aperture 21 in parallel positions generally above and below the second pair of shaft portions 26, 28 (shaft portion 26 not shown in FIG. 5).

Figure 6:
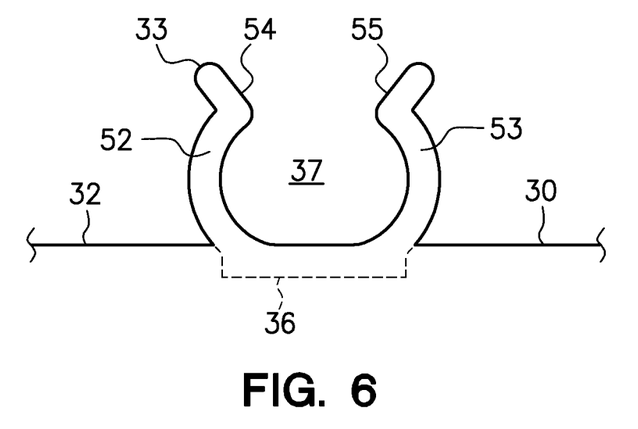
FIG. 6 is elevation side view of the first portion of a spring clip of FIG. 3.

FIG. 6 is an elevation view of the first portion 33 of the spring clip of FIG. 3 to bias the second face of the second base against the second face of the first base to conductively engage the fins on the second base with the heat-generating device. Spring members 52, 53 comprise angled guides 54, 55 which cooperate to guide the first pair of shaft portions or the second pair of shaft portions of the second portion of the spring clip on the second base to the interior 37 of the first portion 33 of the spring clip on the first base to releasably engage the first base 30 with the second base. A foot 36 of the first portion 33 of the spring clip is connected to the first base 30 and recessed therein below second face 32.

Figure 7A:
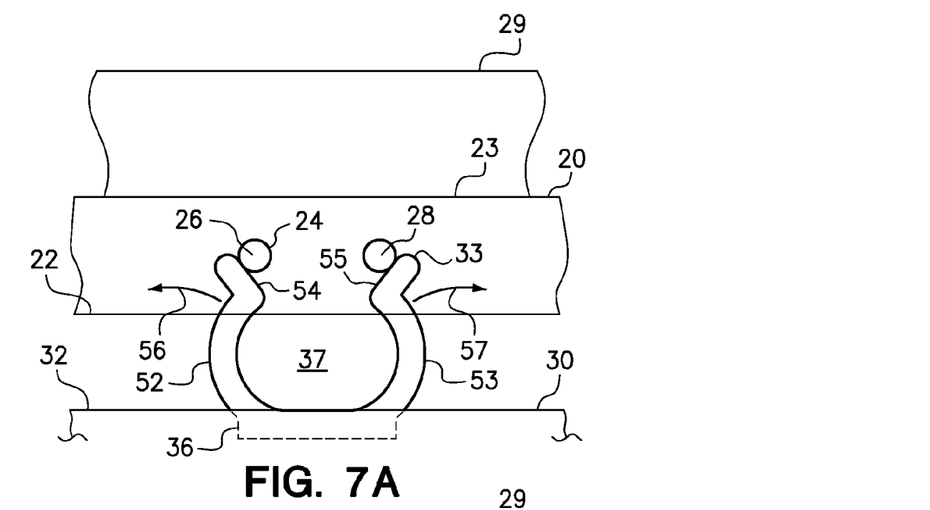
FIG. 7A-7C are side views of the first portion of the spring clip of the first base of FIG. 3 as it releasably engages the second portion of the spring clip of the second base of FIG. 4.
Figure 7B:
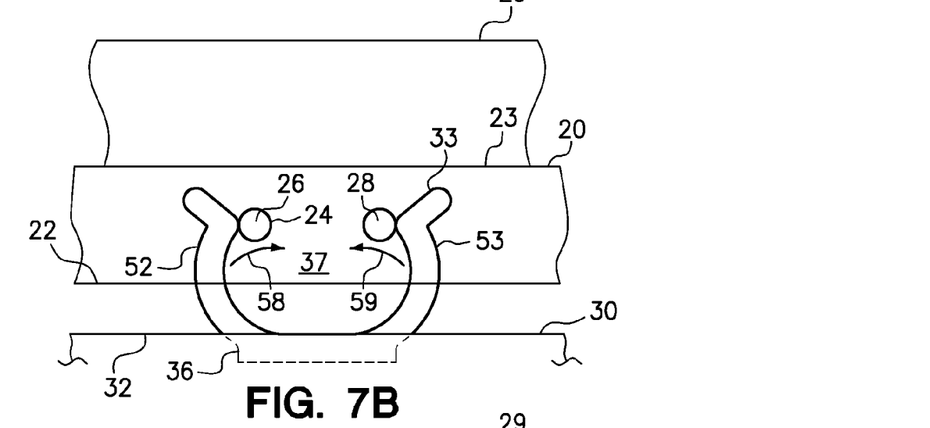
Figure 7C:
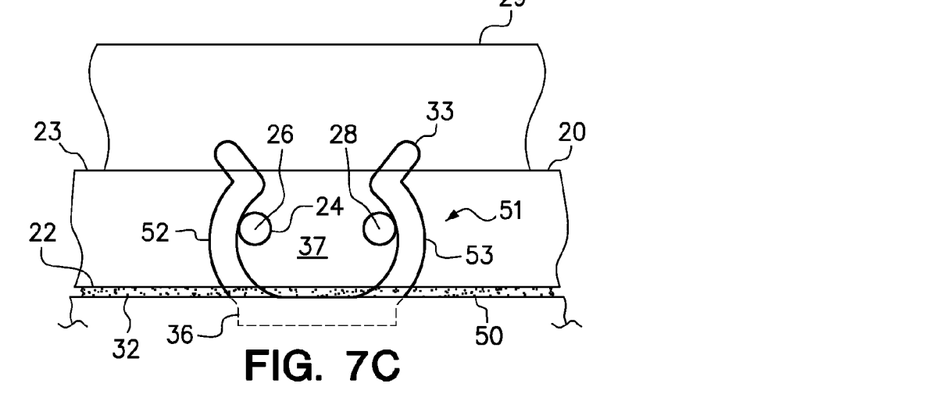

FIGS. 7A-7C are elevation views of the first portion 33 of the spring clip during releasable engagement of the first base 30 with the second portion 24 of the spring clip on the second base 20 to engage the fins 29 on the second base 20 in conductive engagement with the heat-generating device (not shown).

FIG. 7A illustrates initial engagement between the first portion 33 and the second portion 24 as the second pair of shaft portions 26, 28 engage the angled guides 54, 55 on spring members 52, 53, respectively. The application of a downward force on the second portion 24 will elastically displace the spring members 52, 53 to pivot in the direction of arrows 56, 57, respectively. The spring members 52, 53 spread apart to receive the shaft portions 26, 28 to the intermediate position illustrated in FIG. 7B. The second face 22 of the second base 20 is illustrated in FIG. 7A as spaced apart from the second face 32 of the first base 30.

FIG. 7B illustrates the second pair of shaft portions 26, 28 of the second portion 24 of the spring clip disposed in an intermediate position generally between the elastically displaced spring members 52, 53 and above and adjacent to the interior 37 of the first portion 33 of the spring clip. The second face 22 of the second base 20 is illustrated as adjacent to, but still spaced apart from, the second face 32 of the first base 30. Spring members 52, 53 are biased to return to the original positions illustrated in FIG. 7A by movement in the direction of arrows 58, 59.

FIG. 7C illustrates the made-up spring clip 51 comprising the second pair of shaft portions 26, 28 disposed within the interior 37 of the first portion 33 of the spring clip and between the spring members 52, 53 that are restored towards their original positions to capture the shaft portions 26, 28 within the interior 37 of the first portion 33 of the spring clip. A residual restoring force within the spring members 52, 53 acting on the shaft portions 26, 28 serves to bias the second face 22 of the second thermally conductive base 20 against the second face 32 of the first thermally conductive base 30. A thermally conductive material 50 may be disposed intermediate the second face 22 of the second base 20 and the second face 32 of the first base 30 to enhance thermal communication between the second base 20 and the first base 30. The thermally conductive material 50 may be, for example, a thermal grease.

Figure 8:
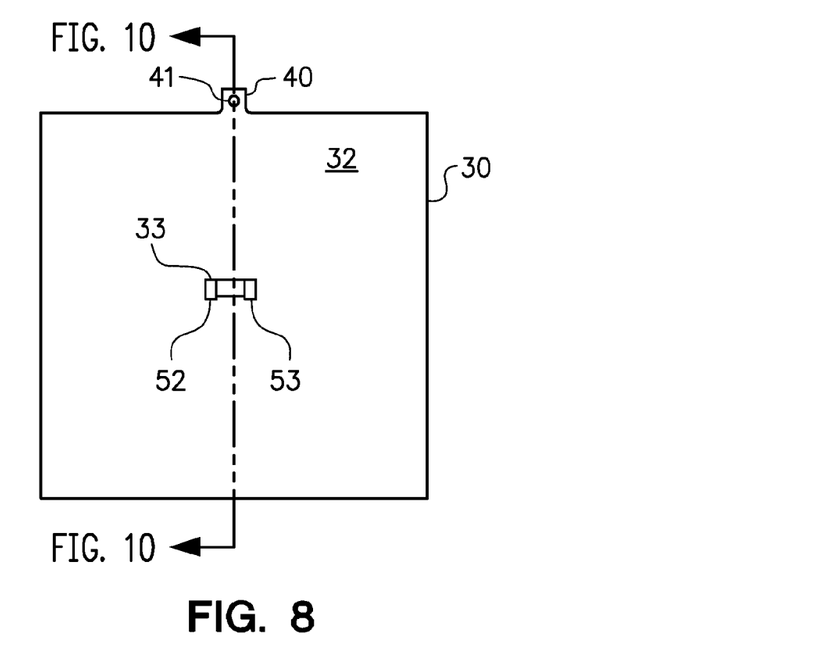
FIG. 8 is a plan view of an alternate embodiment of a first thermally conductive base of the heat sink of the present invention having a key.

FIG. 8 is a plan view of an alternate embodiment of a first base 30 of the heat sink of the present invention having a key 41 to limit the orientations in which a second base may conductively engage the first base 30. In other words, the key 41 prevents rotation between the first and second bases while the first and second bases are engaged. The key 41 is disposed on a tab 40 that protrudes laterally from the side of the first base 30 and the key 41 extends beyond the second surface 32 of the first base 30 towards the viewer of FIG. 8.

Figure 9:
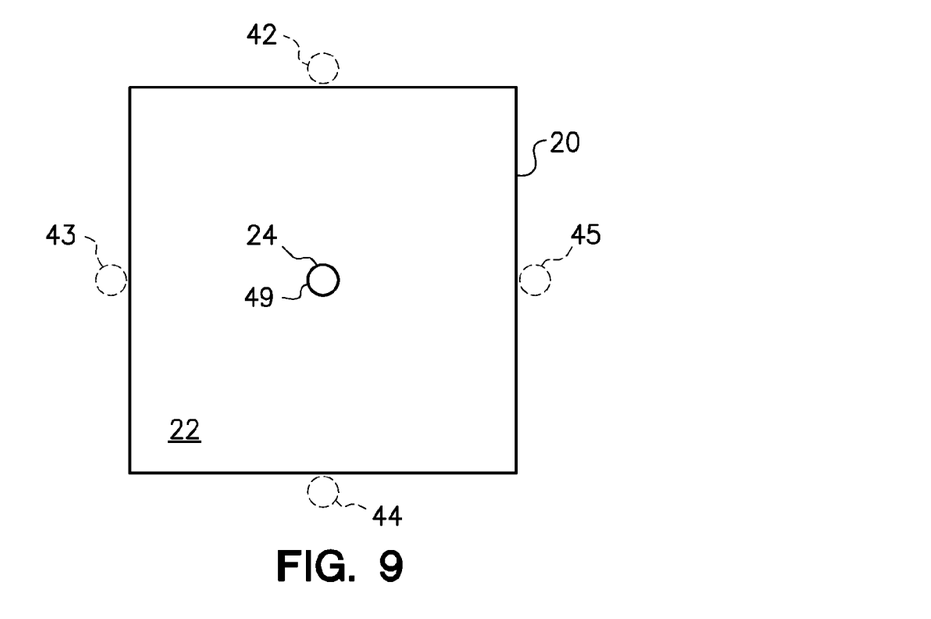
FIG. 9 is a plan view of an alternative embodiment of a second thermally conductive base having a second portion of a spring clip comprising a bulbous member and illustrating positions at which the key of FIG. 8 may be disposed.

FIG. 9 is a plan view of an alternative embodiment of a second base 20 of the heat sink of the present invention having a second surface 22 and a second portion 24 of a spring clip comprising a rounded member 49. FIG. 9 illustrates positions 42, 43, 44, 45 at which the key of FIG. 8 may be disposed in orientations in which the second face 22 of the second base 20 may conductively engage the second face of the first base of FIG. 8 without the key preventing conductive engagement between the second base 20 and the first base 8. It should be noted that the first portion 33 of the spring clip in FIG. 8 and the second portion 24 of the spring clip are axially centered on the first and second bases 30, 20, respectively, such that the square first and second bases will have full face-to-face engagement in either the first orientation or the second orientation.

Figure 10:
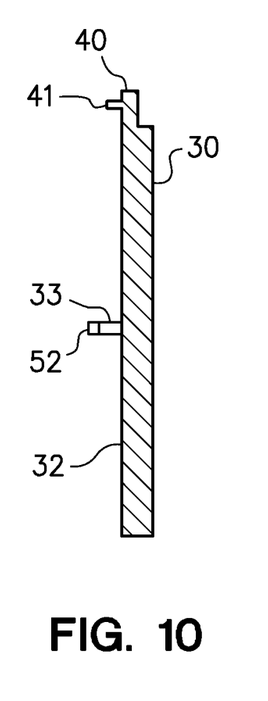
FIG. 10 is a cross-sectional side view of the embodiment of the first base of FIG. 8.

FIG. 10 is a cross-sectional side view of the first base 30 of FIG. 8. The key 41 is disposed on the tab 40 extending from the first base 30 and extends beyond the second surface 32 of the first base 30. The key 41 is disposed in a position to be received in positions indicated on FIG. 9 to permit the second portion 24 of the spring clip on the second base to releasably engage the first portion 33 of the spring clip of the first base 30, and to permit the second face of the second base to conductively engage the second face 32 of the first base 30. The first portion 33 of the spring clip on the first base 30 will receive the rounded member of the second portion of FIG. 9 in four orientations in which the key 41 on the first base 30 will be received in the positions indicated on FIG. 9.

Figure 11:
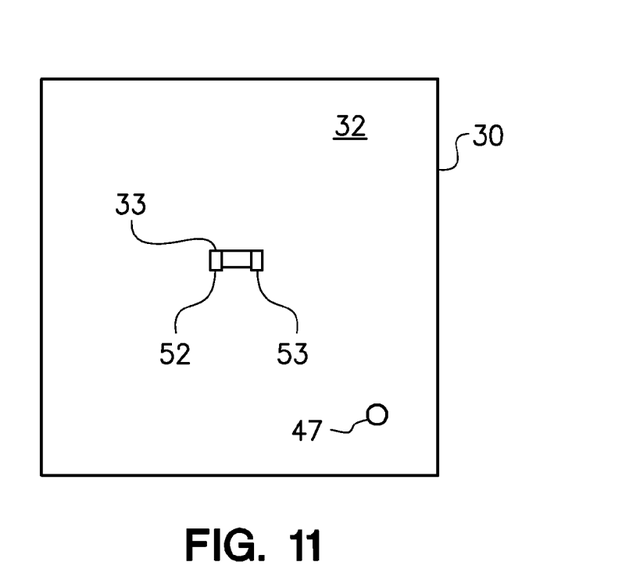
FIG. 11 is a plan view of an alternative embodiment of a first thermally conductive base of the heat sink of the present invention having a key positioned within the periphery of the first base.

FIG. 11 is a plan view of an alternative embodiment of a first base 30 of the heat sink of the present invention having a key 47 positioned within the periphery of the first base 30 to engage a receiving structure disposed on a second base (not shown).

Figure 12:
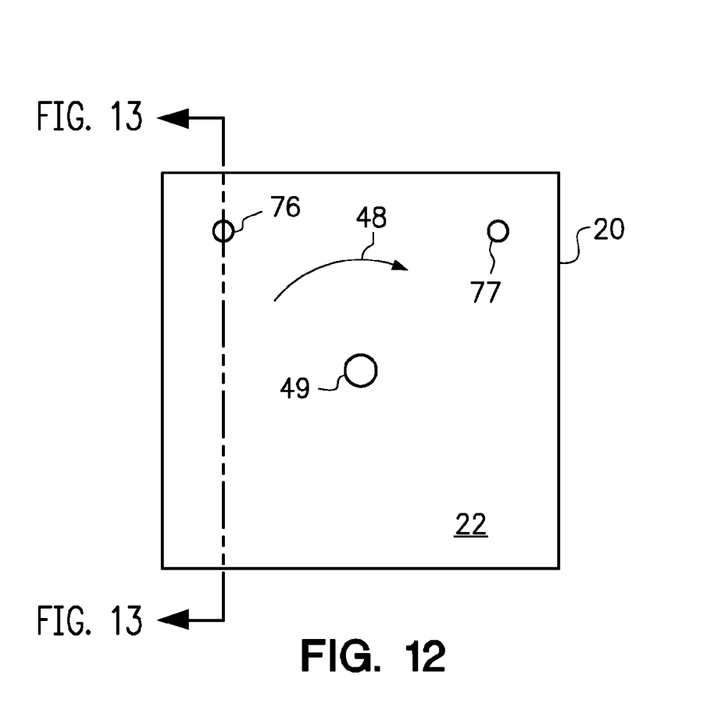
FIG. 12 is a plan view of an alternative embodiment of a second thermally conductive base of the heat sink of the present invention having two recesses positioned to selectively receive the key on the first base of FIG. 11.

FIG. 12 is a plan view of an alternative embodiment of a second base 20 of the heat sink of the present invention having two recesses 76, 77 positioned to selectively receive the key on the first base of FIG. 11 to orient the fins (not shown) supported on a first face (not shown) of the second base. The key 47 (of FIG. 11) may be received into a first recess 76 in a first fin orientation and the key 47 may be received into recess 77 in a second fin orientation that is 90 degrees out of phase with the first fin orientation.

A heat sink comprising the second base 20 of FIG. 12 and the first base 30 of FIG. 11 may be converted from a first fin orientation to a second fin orientation without complete detachment of the first base from the second base. For example, the recess 77 may initially receive the key 47 of the first base 30 of FIG. 11 to conductively engage the second face 32 of the first base 30 of FIG. 11 with the second face 22 of the second base 20 of FIG. 12 and to dispose the fins (not shown) on the first face of the second base 20 in a first fin orientation. Subsequently, the second face 22 of the second base 12 may be separated from the second face 32 of the first base 20 enough to withdraw the key 47 from the recess 77 without fully detaching the first portion 33 of the spring clip on the first base 30 from the second portion 24 of the spring clip on the second base 20. While the second base 30 separated apart from the first base 20, the second base may be rotated 90 degrees in the direction of arrow 48 to align the key 47 on the first base 30 with the recess 76 on the second base 20. The second face 22 of the second base 20 can then conductively re-engage the second face 32 of the first base 30 to dispose the fins (not shown) on the first face of the second base 20 in a second fin orientation 90 degrees out of phase with the first fin orientation.

Figure 13:
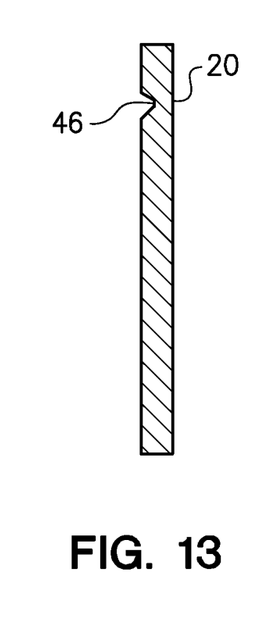
FIG. 13 is a cross-sectional side view of the embodiment of the second base of FIG. 12.

FIG. 13 is a side section view of the second base 20 of FIG. 12 illustrating the recess 46 disposed in the second base 20 to receive the key 47 of the first base to orient the fins in the first fin orientation.

It will be understood that while the embodiments illustrated in FIGS. 3-13 may illustrate one or more keys disposed on the first base 30 and one or more notches, recesses, channels or bays disposed on the second base 20 to limit the orientations in which the first base may conductively engage the second base and thereby orient the fins on the second base, it is within the scope of the invention to provide one or more keys on the second base to engage one or more notches, recesses, channels or bays on the first base. Similarly, while, in certain embodiments, a first portion 33 of a spring clip is disposed on a first base 30 and a second portion 24 of a spring clip is disposed on a second base 20 to limit the orientations in which the first base 30 may conductively engage the second base and thereby orient the fins on the second base 20, it is within the scope of the invention to provide a first portion of a spring clip on the second base to releasably engage a second portion of a spring clip on a first base with equal function. The present invention includes these variations and is limited only by the claims that follow.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heat sink, comprising:
   a first thermally conductive base having a first face securable to a heat-generating electronic device and a second face opposite the first face;
   a second thermally conductive base having a first face with a plurality of fins and a second face to engage the second face of the first base;
   a biasing member disposed generally central to the second face of the first base and the second face of the second base to bias the second face of the first base against the second face of the second base in a first orientation or in a second orientation;
   an alignment member extending from at least one of the first base and the second base to prevent relative rotation therebetween from the first orientation and from the second orientation except during separation of the first and second bases;
   wherein the second base is movable relative to the first base 90 degrees from the first orientation to the second orientation by overcoming the biasing member to remove the second face of the second base from engagement with the second face of the first base, rotating the second base 90 degrees relative to the first base from the first orientation to the second orientation, and re-engaging the second face of the first base with the second face of the second base.

2. The heat sink of claim 1, wherein the alignment member obstructs engagement of the second face of the first base with the second face of the second base at orientations other than the first orientation and the second orientation.

3. The heat sink of claim 1, wherein the biasing member includes a rounded member to facilitate rotation between the first base and the second base, wherein the rounded member facilitates rotation between the first base and the second base with the second face of the second base removed from engagement with the second face of the first base.

4. The heat sink of claim 1, wherein the alignment member protrudes from the second base, and wherein the first base includes a first receiving element to receive the alignment member in the first orientation and a second receiving element to receive the alignment member in the second orientation.

5. The heat sink of claim 4, wherein the first receiving element on the first base is positioned 90 degrees out of phase with the second receiving element on the first base.

6. The heat sink of claim 1, wherein the alignment member protrudes from the first base, and wherein the second base includes a first receiving element to receive the alignment member in the first orientation, and a second receiving element to receive the alignment member in the second orientation.

7. The heat sink of claim 6, wherein the first receiving element on the second base is positioned 90 degrees out of phase with the second receiving element on the second base.

8. The heat sink of claim 1, further comprising:
   a thermally conductive material disposed intermediate the second face of the first base and the second face of the second base.

9. The heat sink of claim 8, wherein the thermally conductive material is at least one of liquid metal and thermal grease.

10. The heat sink of claim 1, wherein the biasing member includes a spring clip.

11. The heat sink of claim 1, wherein the biasing member includes a rounded member receivable into a spreadable spring clip.

12. The heat sink of claim 10, wherein the biasing member includes a first pair of parallel shaft portions and a second pair of parallel shaft portion 90 degrees out of phase with the first pair of shaft portions, the first and second pairs of shaft portions disposed on at least one of the first base and second base.

13. The heat sink of claim 1, wherein the biasing member maintains biased coupling of the first base to the second base during rotation, and wherein the biasing member forms a central axis of rotation between the first base and the second base.

14. A heat sink comprising:
- a first thermally conductive base having a first face to engage a heat-generating electronic component and a second face;
- a second thermally conductive base having a first face to support at least one fin and a second face to conductively engage the second face of the first base;
- a biasing member having a first portion attached to the second face of the first base and a second portion attached to the second face of the second base to bias the second face of the second base against the second face of the first base;
- an alignment structure disposed on one of the first base and the second base to impair the second face of the second base from full engagement with the second face of the first base in orientations other than a first orientation and a second orientation 90 degrees out of phase with the first orientation.

15. The heat sink of claim 14, wherein the at least one fin comprises a plurality of fins.

16. The heat sink of claim 14, wherein the biasing member comprises a spring clip.

17. The heat sink of claim 16, wherein the biasing member also comprises an alignment structure.

18. The heat sink of claim 14, wherein the alignment structure comprises a key, a first receiving member and a second receiving member disposed 90 degrees out of phase with the first receiving member.

19. The heat sink of claim 18, wherein the alignment structure comprises a key disposed on at least one of the first base and the second base and the first receiving member and second receiving member disposed on the other of the first base and the second base to selectively engage the key.

20. The heat sink of claim 14, further comprising a thermally conductive material disposed intermediate the second face of the first base and the second face of the second base.

* * * * *